United States Patent
You

(10) Patent No.: US 9,312,030 B2
(45) Date of Patent: Apr. 12, 2016

(54) APPARATUS AND METHOD FOR ACQUIRING DATA OF FAST FAIL MEMORY

(71) Applicant: UNITEST INC., Gyeonggi-do (KR)

(72) Inventor: Ho Sang You, Seoul (KR)

(73) Assignee: UNITEST INC., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/446,462

(22) Filed: Jul. 30, 2014

(65) Prior Publication Data
US 2015/0039951 A1  Feb. 5, 2015

(30) Foreign Application Priority Data

Jul. 31, 2013 (KR) .......................... 10-2013-0090906

(51) Int. Cl.
| | |
|---|---|
| *G11C 29/38* | (2006.01) |
| *G11C 29/12* | (2006.01) |
| *G11C 29/56* | (2006.01) |
| *G06F 11/22* | (2006.01) |
| *G11C 29/54* | (2006.01) |

(52) U.S. Cl.
CPC ................ *G11C 29/12* (2013.01); *G06F 11/22* (2013.01); *G11C 29/56004* (2013.01); *G11C 29/56008* (2013.01)

(58) Field of Classification Search
CPC ............. G11C 29/12; G11C 29/56004; G11C 29/56008; G11C 29/56; G11C 29/48; G11C 29/40; G11C 29/44; G06F 11/22
See application file for complete search history.

(56) References Cited

U.S. PATENT DOCUMENTS

| | | | | |
|---|---|---|---|---|
| 5,502,733 | A * | 3/1996 | Kishi et al. ..................... | 714/748 |
| 2003/0191995 | A1* | 10/2003 | Abrosimov et al. .......... | 714/719 |
| 2006/0026482 | A1* | 2/2006 | Fujisaki ........................ | 714/742 |
| 2008/0034265 | A1 | 2/2008 | Kang | |

FOREIGN PATENT DOCUMENTS

KR      10-0540506 B1    1/2006

\* cited by examiner

*Primary Examiner* — April Y Blair
*Assistant Examiner* — Dipakkumar Gandhi
(74) *Attorney, Agent, or Firm* — Rabin & Berdo, P.C.

(57) ABSTRACT

An apparatus and method for acquiring data of fast fail memory includes a pattern generator for generating a pattern to be recorded to a device under test (DUT) and receiving DUT data from the DUT; a data transmitter for sending the DUT data and the pattern generated so as to correspond thereto to a failure analyzer from the pattern generator; and a failure analyzer for analyzing the DUT data and the pattern generated so as to correspond to the DUT data, which are received from the data transmitter, thus producing failure analysis information. The data transmitter (FIFO) able to advance the failure analysis time allows failure analysis to be performed before completion of testing, thereby shortening the total failure analysis time and overcoming hardware limitations for failure analysis.

5 Claims, 4 Drawing Sheets

4

APPARATUS AND METHOD FOR ACQUIRING DATA OF FAST FAIL MEMORY

BACKGROUND OF THE INVENTION

1. Field of the Invention

The present invention relates to an apparatus and method for acquiring data of fast fail memory, and more particularly, to an apparatus and method for acquiring data of fast fail memory, wherein in the operation of fail memory (FM) for failure analysis in a memory test device, failure information may be acquired in real time by comparing data recorded to a pattern generator with data read from memory under test even before completion of testing.

2. Description of the Related Art

In conventional memory test devices, memory under test (which is a device under test (DUT)) is coupled with a pattern generator for testing thereof, so that predetermined data is recorded to DUT and read again to determine whether the data is normal or not.

Korean Patent No. 540506 (Algorithm pattern producer for memory device test and memory tester using the same) discloses a technique for a data comparing part configured to compare test data with data produced from a data producing part with respect to individual clock cycles and to store information about fail memory.

As such, failure data may be analyzed by obtaining information regarding accurate failure analysis and recovery processing from not only data matching/non-matching but also information and data for failure address of the corresponding memory.

However, such information is undesirably obtained in such a manner that the data recorded in the pattern generator is compared with the data read from the DUT, and the comparison result is stored in an additional recording space, and after completion of the test, whether the data is normal or not may be determined using a failure analyzer such as a computer in the additional recording space.

As illustrated in FIG. 1, a failure analyzer 3 including a personal computer (PC) cannot conventionally access failure analysis information during storage in FM 2, in order to record failure information in a pattern generator 1.

To analyze failure, access is possible after completion of generation of the pattern in the pattern generator 1. Thus, because failure may be analyzed after completion of the pattern programming of the pattern generator 1, a sum of the patterning time of the pattern generator 1 and the failure analysis time is regarded as a final period of time taken to analyze failure.

Also, when the amount of analysis information which may be stored at once is greater than that of FM 2, it cannot be stored. Further, patterning should be performed after repetition of the same work several times.

SUMMARY OF THE INVENTION

Accordingly, the present invention has been made keeping in mind the above problems occurring in the prior art, and an object of the present invention is to provide an apparatus and method for acquiring data of fast FM, wherein a data transmitter (first-in-first-out (FIFO)) able to advance the failure analysis time is provided so that failure analysis may be executed before completion of a test, thereby shortening the total failure analysis time and overcoming hardware limitations for failure analysis.

In order to accomplish the above object, the present invention provides an apparatus for acquiring data of fast fail memory, comprising: a pattern generator for generating a pattern to be recorded to a device under test (DUT) and receiving DUT data from the DUT; a data transmitter for sending the DUT data and the pattern generated corresponding thereto from the pattern generator to a failure analyzer; and the failure analyzer for analyzing the DUT data and the pattern generated corresponding to the DUT data, which are received from the data transmitter, thus producing failure analysis information.

The pattern generator may generate and send the pattern to be recorded to the DUT, and apply the DUT data received from the DUT and the pattern generated to the data transmitter.

The data transmitter may receive the pattern to be recorded to the DUT and the DUT data corresponding to the pattern from the pattern generator and send those to the failure analyzer 3, and under the control of FIFO, the pattern to be recorded to the DUT and the DUT data corresponding to the pattern, which are applied from the pattern generator, are sequentially sent to the failure analyzer.

The failure analyzer may comparatively determine whether the pattern of the pattern generator and the DUT data of the DUT, which are received from the data transmitter, are matched with each other, and when the pattern of the pattern generator is not matched with the DUT data, extract non-matched DUT data and memory failure address corresponding thereto, to produce failure information.

In addition, the present invention provides a method of acquiring data of fast fail memory, comprising: (a) generating a pattern to be recorded to DUT and receiving DUT data from the DUT, by a pattern generator; (b) sending the DUT data and the pattern generated corresponding thereto from the pattern generator to a failure analyzer, by a data transmitter; and (c) analyzing the DUT data and the pattern generated corresponding to the DUT data, which are received from the data transmitter, thus producing failure analysis information, by a failure analyzer.

Also, (c) may comprise: (c-1) determining whether the pattern of the pattern generator and the DUT data of the DUT, which are received from the data transmitter, are matched with each other, by the failure analyzer; and (c-2) extracting non-matched DUT data and memory failure address corresponding thereto when the pattern of the pattern generator and the DUT data of the DUT are not matched with each other in (c-1), thus producing failure information, by the failure analyzer.

According to the present invention, a data transmitter (FIFO) able to advance the failure analysis time is provided, so that failure analysis can be executed before completion of a test, thereby shortening the total failure analysis time and overcoming hardware limitations for failure analysis.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Hereinafter, a detailed description will be given of the present invention with reference to the appended drawings. Throughout the detailed description, the terms or words used in the specification and claims shall not be construed as being limited to meanings generally used or defined in dictionaries, and shall be understood as having meanings and concepts adapted for the technical spirit of the present invention on the assumption that inventors may appropriately define the concepts of terms in order to more efficiently explain the invention. In the following description, it is noted that, when the detailed description of known techniques related with the present invention may make the gist of the present invention unclear, a detailed description thereof will be omitted.

Figure 1:
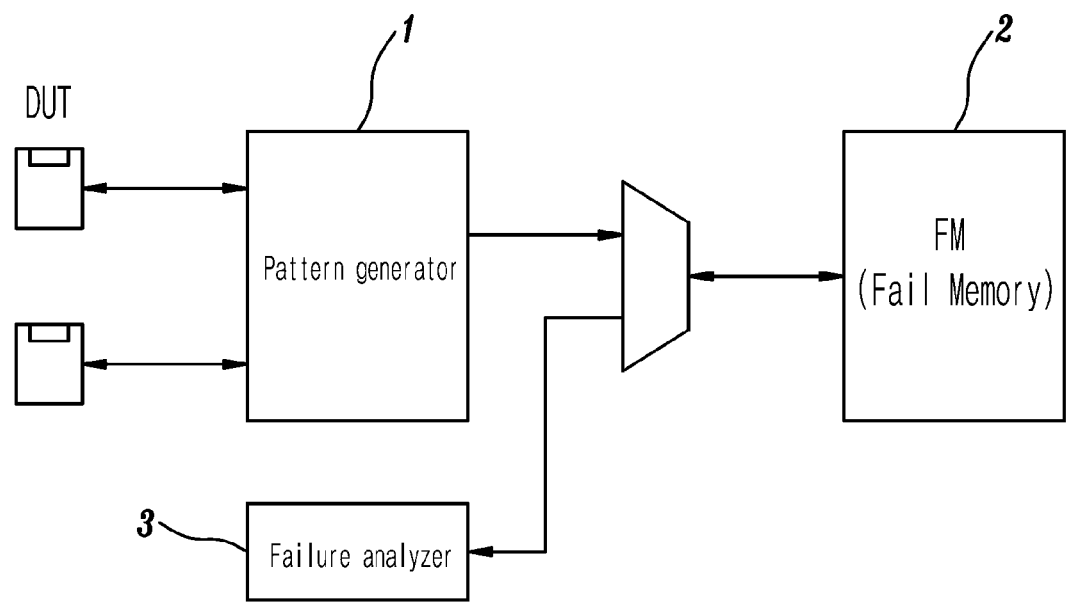
FIG. 1 is a view illustrating a conventional apparatus for analyzing failure including a pattern generator.
Figure 2:
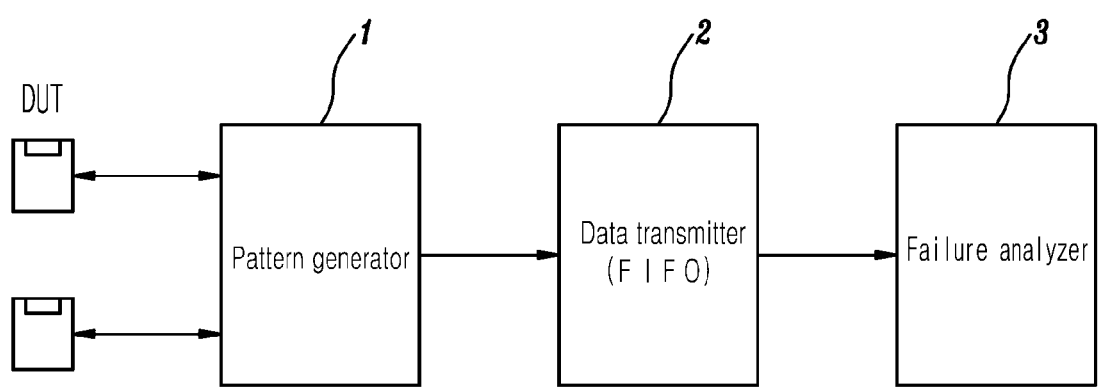
FIG. 2 is a view illustrating an apparatus for acquiring data of fast FM according to the present invention.

As illustrated in FIG. 2, an apparatus A for acquiring data of fast FM according to the present invention includes a pattern generator 1 for generating a pattern to be recorded to DUT and receiving recorded data from the DUT (hereinafter referred to as "DUT data"); a data transmitter 2 for sending the DUT data and the pattern generated so as to correspond thereto to a failure analyzer 3 from the pattern generator 1; and a failure analyzer 3 for analyzing the DUT data and the pattern generated so as to correspond to the DUT data, which are received from the data transmitter 2, to thus produce failure analysis information.

Specifically, the pattern generator 1 is configured such that the pattern to be recorded to the DUT is generated and sent to the DUT, and also the DUT data is received from the DUT and applied to the data transmitter 2 together with the generated pattern.

The data transmitter 2 is configured such that the pattern to be recorded to the DUT and the DUT data corresponding to the pattern are applied from the pattern generator 1 and sent to the failure analyzer 3.

Under the control of FIFO, the data transmitter 2 sequentially sends the pattern to be recorded to the DUT and the DUT data corresponding to the pattern, which are applied from the pattern generator 1, to the failure analyzer 3.

The failure analyzer 3 determines whether the pattern of the pattern generator 1 and the DUT data of the DUT, which are received from the data transmitter 2, are matched with each other. When the pattern of the pattern generator 1 is not matched with the DUT data, the non-matched DUT data and the memory failure address corresponding thereto are extracted to thus produce failure information.

As such, the failure analyzer 3 includes a data storage device, which is provided in the form of a hard disk of PC and thus has high capacity compared to conventional FM.

Figure 3:
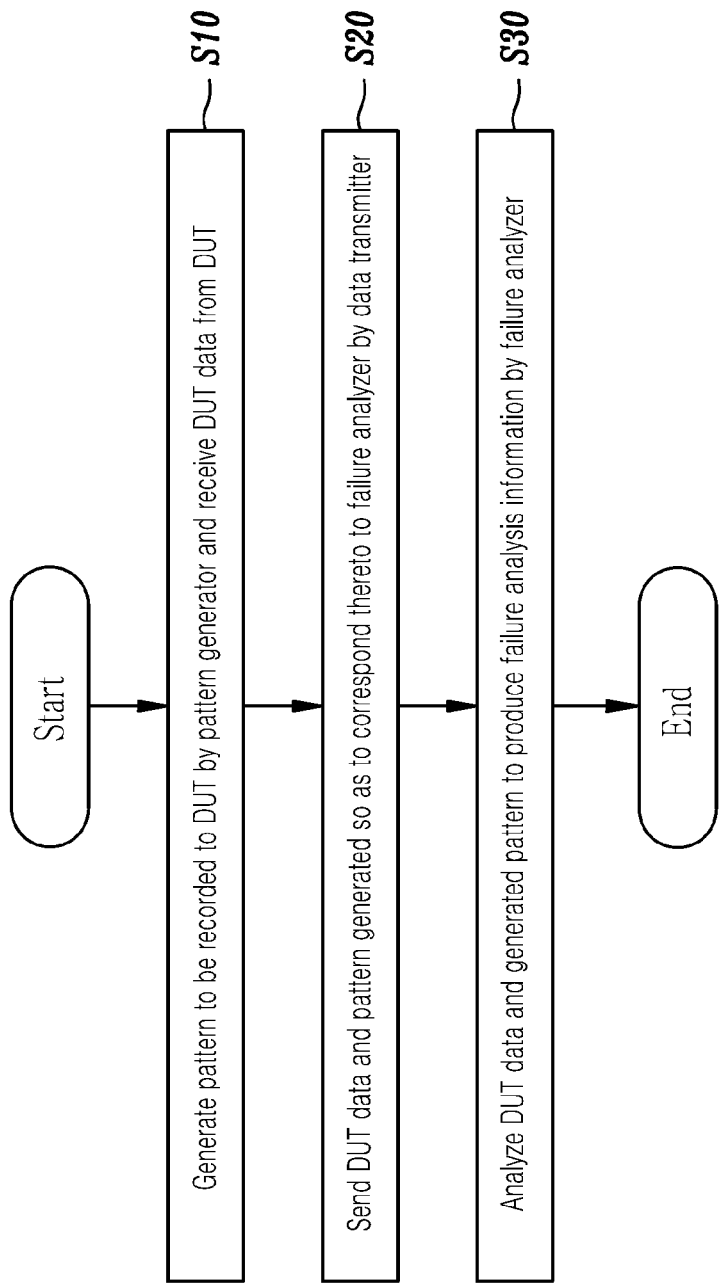
FIG. 3 is a flowchart illustrating a process of acquiring data of fast FM according to the present invention.

With reference to FIG. 3, the method of acquiring the data of fast FM according to the present invention is described below.

Specifically, by a pattern generator 1, a pattern to be recorded to DUT is generated, and also DUT data is received from the DUT (S10).

Subsequently, by a data transmitter 2, the DUT data and the pattern generated so as to correspond thereto are sent to a failure analyzer 3 from the pattern generator 1 (S20).

By the failure analyzer 3, the DUT data and the pattern generated so as to correspond to the DUT data, which are received from the data transmitter 2, are analyzed, thus producing failure analysis information (S30).

Figure 4:
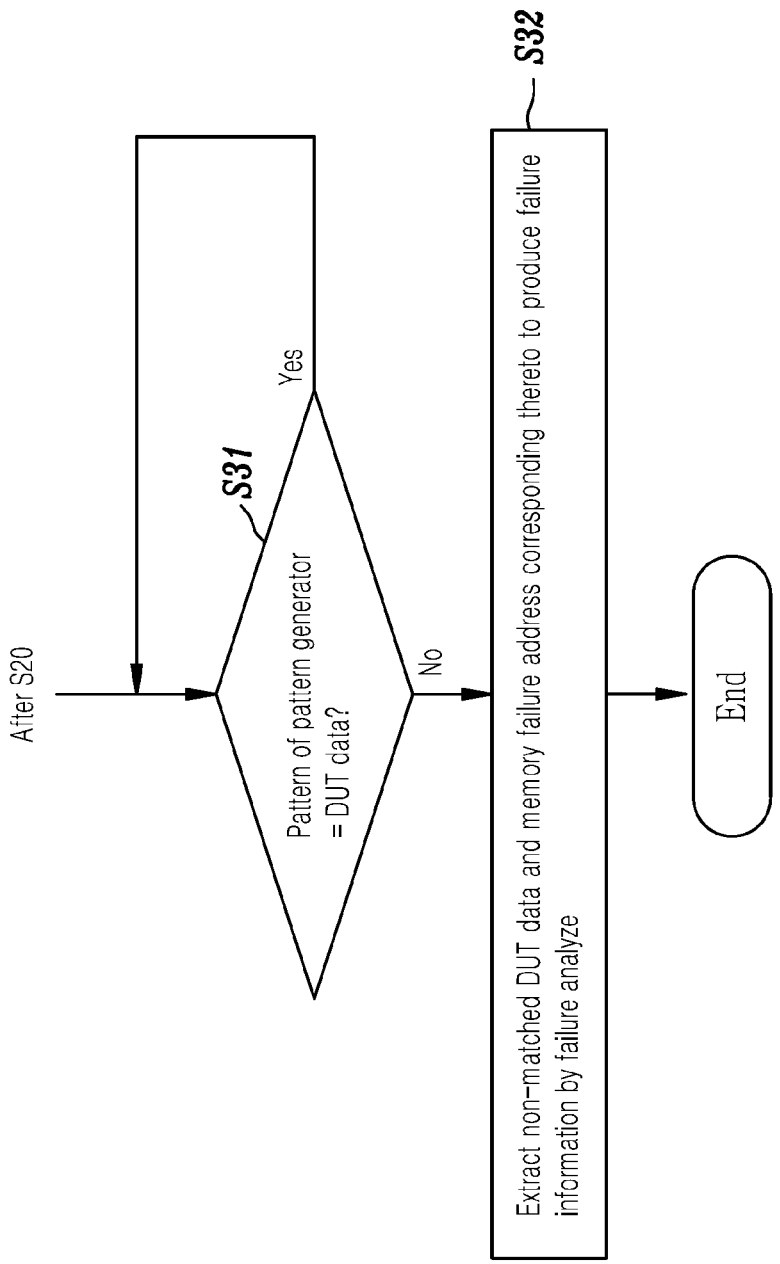
FIG. 4 is a flowchart specifically illustrating S30 in the process of acquiring data of fast FM according to the present invention.

Turning now to FIG. 4, S30 in the method of acquiring the data of fast FM according to the present invention is specified below.

After S20, the failure analyzer 3 determines whether the pattern of the pattern generator 1 and the DUT data of the DUT, which are received from the data transmitter 2, are matched with each other (S31).

Based on the result of determination in S31, when the pattern of the pattern generator 1 is not matched with the DUT data, the failure analyzer 3 extracts the non-matched DUT data and the memory failure address corresponding thereto to thus produce failure information (S32).

Although the embodiments of the present invention have been disclosed for illustrative purposes, those skilled in the art will appreciate that a variety of different variations and modifications are possible, without departing from the scope and spirit of the invention as disclosed in the accompanying claims. Accordingly, such variations and modifications should also be understood as falling within the scope of the present invention.

What is claimed is:

1. An apparatus for acquiring data of fail memory, comprising: a pattern generator generating a pattern for testing a device under test (DUT) and transmitting the pattern to the DUT, the pattern generator receiving DUT data from the DUT, wherein the DUT is connected to the pattern generator, records the pattern received from the pattern generator and retrieves the DUT data corresponding to the pattern recorded therein; a data transmitter connected to the pattern generator and receiving the pattern and the DUT data from the pattern generator, the data transmitter transmitting the DUT data and the pattern received from the pattern generator to a failure analyzer; and the failure analyzer connected to the data transmitter, receiving the DUT data and the pattern from the data transmitter and comparing the DUT data and the pattern to produce failure analysis information.

2. The apparatus of claim 1, wherein the data transmitter receives the pattern and the DUT data corresponding to the pattern from the pattern generator and transmits those to the failure analyzer in a first-in-first-out (FIFO) order.

3. The apparatus of claim 1, wherein with comparing the pattern and the DUT data with each other, when the pattern is not matched with the DUT data corresponding to the pattern, the failure analyzer extracts an address corresponding to the non-matched DUT data.

4. A method of acquiring data of fail memory, comprising: generating a pattern for testing a device under test (DUT) and transmitting the pattern to the DUT, by a pattern generator; receiving, by the DUT, the pattern from the pattern generator and recording the pattern in the DUT; receiving, by the pattern generator, DUT data from the DUT, the DUT data corresponding to the pattern recorded in and retrieved from the DUT; transmitting, by the pattern generator, the DUT data received from the DUT and the pattern to a data transmitter; receiving, by the data transmitter, the DUT data and the pattern from the pattern generator; transmitting the DUT data and the pattern from the pattern generator to a failure analyzer, by the data transmitter; and receiving the DUT data and the pattern from the data transmitter and comparing the DUT data and the pattern to produce failure analysis information, by failure analyzer.

5. The method of claim 4, wherein
after comparing the pattern and the DUT data by the failure analyzer, when the pattern is not matched with the DUT data corresponding to the pattern with each other extracting an address corresponding to the non-matched DUT data by the failure analyzer.

\* \* \* \* \*